United States Patent [19]

Reed et al.

[11] Patent Number: 5,128,543

[45] Date of Patent: Jul. 7, 1992

[54] PARTICLE ANALYZER APPARATUS AND METHOD

[75] Inventors: David A. Reed; Bruno W. Schueler, both of Redwood City, Calif.

[73] Assignee: Charles Evans & Associates, Redwood City, Calif.

[21] Appl. No.: 425,568

[22] Filed: Oct. 23, 1989

[51] Int. Cl.⁵ .............................................. H01J 49/40
[52] U.S. Cl. ................................... 250/287; 250/294; 250/296
[58] Field of Search .............. 250/287, 309, 306, 307, 250/298, 299, 286, 281, 282

[56] References Cited

U.S. PATENT DOCUMENTS

| | | | |
|---|---|---|---|
| 3,761,707 | 9/1973 | Liebl | 250/298 |
| 3,863,068 | 1/1975 | Poshenrieder | 250/287 |
| 4,255,656 | 3/1981 | Barrie et al. | 250/310 |
| 4,486,659 | 12/1984 | Turner | 250/306 |
| 4,556,794 | 12/1985 | Ward et al. | 250/309 |
| 4,672,204 | 6/1987 | Slodzian et al. | 250/298 |
| 4,737,639 | 4/1988 | Rusch | 250/397 |
| 4,754,135 | 6/1988 | Jackson | 250/287 |
| 4,889,987 | 12/1989 | Gruen et al. | 250/287 |
| 4,912,326 | 3/1990 | Naito | 250/309 |
| 4,912,327 | 3/1990 | Waugh | 250/287 |
| 4,945,236 | 7/1990 | Mogami et al. | 250/287 |

Primary Examiner—Jack I. Berman
Assistant Examiner—Kiet T. Nguyen
Attorney, Agent, or Firm—Limbach & Limbach

[57] ABSTRACT

A time-of-flight analyzer, such as a secondary ion surface analyzer, and method are disclosed wherein a beam of charged particles is created, magnified, directed along a path to a detector, detected and the time of flight measured. An emission lens is positioned on the path to produce the magnification and an additional lens can be provided along the path to produce variable magnification. A field aperture along the path limits the size of the image and a contrast diaphragm limits the lateral ion velocity. Two or more, preferably three, particle steering analyzers are sequentially positioned along the path from the emission lens to the detector with each of the three analyzers steering the particles through substantially 90 degrees.

9 Claims, 6 Drawing Sheets

PARTICLE ANALYZER APPARATUS AND METHOD

TECHNICAL FIELD

The present invention relates in general to a particle analyzer apparatus and method and more particularly to a time-of-flight analyzer such as a time-of-flight secondary ion mass spectrometer or microscope.

BACKGROUND OF THE INVENTION

Secondary ion microscopes are mostly used to provide laterally resolved atomic surface and/or in-depth concentration profiles with high sensitivity. In general, the target surface to be analyzed is sequentially bombarded by a primary ion beam which causes charged and neutral particles to be emitted. The emitted secondary ions are then extracted from the target into the ion optical system which projects a magnified ion image of the target surface onto a suitable detector. State-of-the-art ion microscopes use mass dispersing optical systems, and the secondary ion image of each secondary ion type has to be evaluated separately.

Various designs and proposals for time of flight mass spectrometers have been described in the literature including the papers in the *International Journal of Mass Spectrometry and Ion Physics* by W. P. Poschenrieder, "Multiple-Focusing Time-Of-Flight Mass Spectrometers Part II. TOFMS With Equal Energy Acceleration", Vol. 9, pp 357-373 (1972); by G. H. Oetjen et al, "Focussing Errors of a Multiple-Focussing Time-Of-Flight Mass Spectrometer With an Electrostatic Sector Field", Vol. 16, pp 353-367 (1975); and by H. Wollnik et al, "A Q-Value For Energy-Focused, Time-Of-Flight Spectrometers, Vol. 37, pp 209-225 (1981) and in the *International Journal of Mass Spectrometry and Ion Processes* by T. Sakurai et al, "Ion Optics for Time-Of-Flight Mass Spectrometers with Multiple Symmetry", Vol. 63, pp 273-287 (1985) and by T. Sakurai et al, "A Time-Of-Flight Mass Spectrometer", Vol.66, pp 283-290 (1985).

SUMMARY OF THE INVENTION

The present invention is directed to a time-of-flight analyzer apparatus and method in which charged particles are produced at a location and a beam of the charged particles is magnified and transported along a path to an image detector so that a magnified image of the particles is produced at the detector.

An aspect of this invention is the provision of method and means for producing mass resolved images of the charged particle image.

In a preferred embodiment of this invention the time-of-flight analyzer takes the form of a time-of-flight ion mass spectrometer useful in a preferred application as a surface analyzer. An entire analytical area of a surface is bombarded, and the ions from each image point or pixel are simultaneously mass analyzed and detected while maintaining the x,y position of the emission point of each ion.

In accordance with certain specific aspects of the present invention, the mass spectrometer portion of the analyzer incorporates at least an emission lens positioned along the ion path to accelerate the charged particles.

In accordance with another aspect of this invention method and means are provided for displaying the particle image detected at selected times.

Another aspect of the invention of the preceding paragraph is the provision of a position sensitive detector for detecting the particle image and means for displaying the particle image for observation.

In accordance with yet another specific aspect of this invention at least one additional lens besides the emission lens is positioned on the beam bath for producing variable magnification.

Another aspect of the analyzer of this invention is inclusion of an aperture along the path between the emission lens and the detector for limiting the size of the beam.

Still another aspect of the analyzer is inclusion of two or more steering means spaced sequentially along the path between the emission lens and the detector. Preferably these steering means comprise three spherical analyzers spaced sequentially along the path with each spherical analyzer steering the charged particles through substantially 90 degrees.

In accordance with the last mentioned aspect the three spherical analyzers have substantially equal radii and with the spacing between adjacent spherical analyzers substantially equal to such radii.

Still another aspect of this invention is the provision of a resistive anode encoder means and method for producing mass resolved images of the charged particle image.

In accordance with still another aspect of this invention the emission lens and each of the spherical analyzers of the prior aspects includes object-side and image-side focal planes and entrance and exit surfaces and the lens and steering means provide a plurality of crossover points of the charged particles with the path including a first crossover point close to the image-side focal plane of the emission lens, a second crossover point close to the object-side focal plane of the first spherical analyzer, a third crossover point close to the entrance surface of the second spherical analyzer and a fourth crossover point close to the exit surface of the third spherical analyzer means.

Yet another aspect of this invention is the provision of a microfocused ionization source for producing the charged particles.

These aspects and other features and advantages of the present invention will become more apparent upon a perusal of the following specification taken in conjunction with the accompanying drawings wherein similar characters of reference refer to similar elements in each of the several views.

DESCRIPTION OF THE PREFERRED EMBODIMENT

Figure 1:
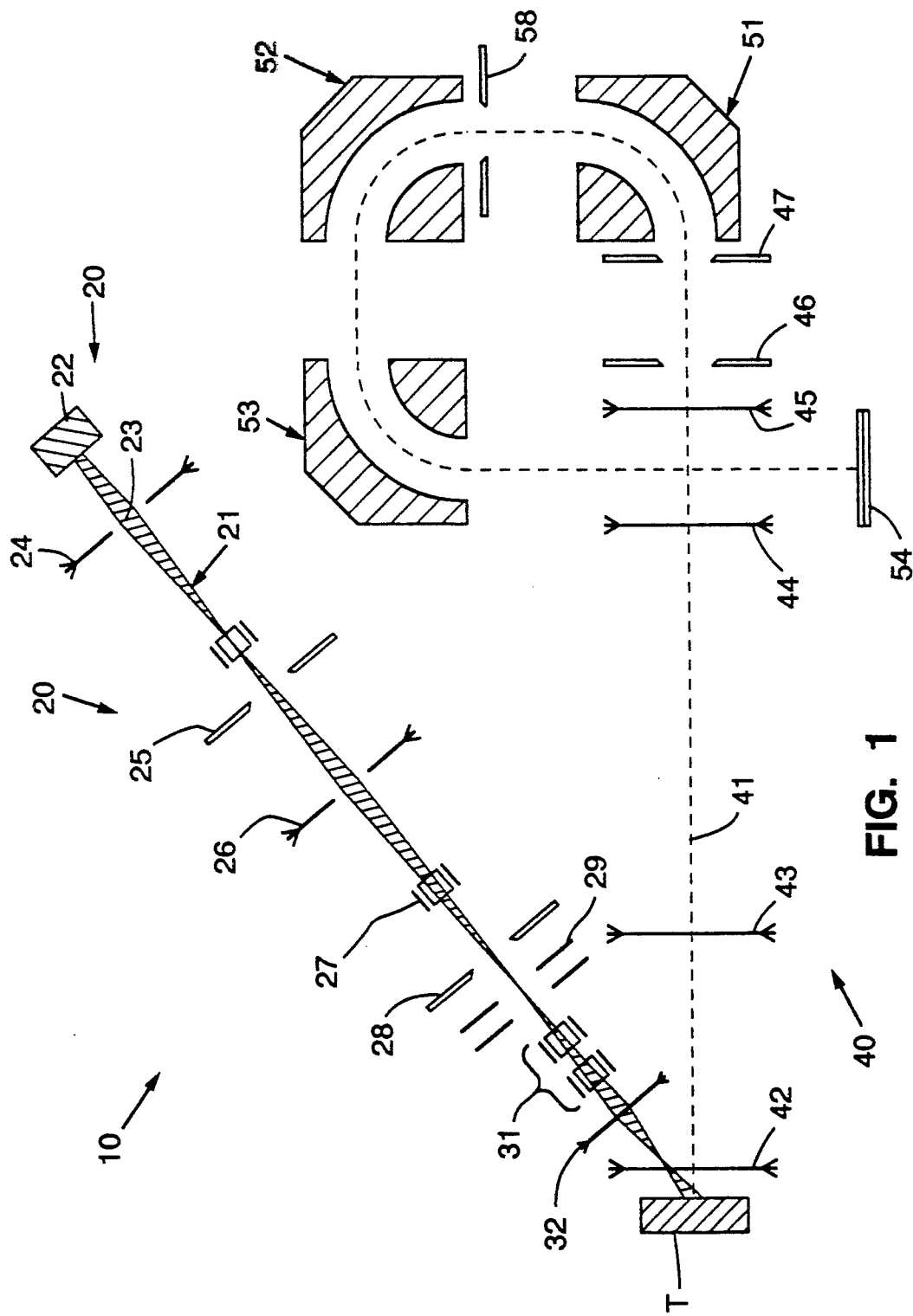
FIG. 1 is a schematic drawing illustrating the ion optical elements of the present invention.

While the present invention is directed broadly to a charged particle analyzer useful with different charged particles which can be produced in different ways and for a number of different applications, a preferred embodiment of the invention takes the form of a time-of-flight secondary ion mass analyzer useful as a surface analyzer as described below and illustrated in the drawings.

Referring now to the drawing, with particular reference to FIG. 1, there is illustrated a time-of-flight surface analyzer or time-of-flight secondary ion mass spectrometer or time-of-flight ion microscope 10 in accordance with the preferred embodiment of the present invention. The surface analyzer 10 includes an assembly for generating charged particles which are then transported and image magnified for detection and display. With the preferred embodiment as a time-of-flight secondary ion mass spectrometer, the surface analyzer 10 of this embodiment includes a primary ion assembly 20 for directing primary ions to a target sample T at which secondary ions are ejected and directed through a secondary ion assembly 40 for detection, display, and recording.

The primary ions re generated along a primary ion beam path 21 from an ion gun 22 such as a General Ionex cesium ion gun which produces a 15 keV Cs+ primary ion beam 23. The unpulsed beam is focused by a first gun transfer lens 24 onto a primary beam aperture 25 such as of 200 $\mu$diameter. This small spot is imaged by a gun transfer lens 26 through timing deflector electrodes 27 onto a timing aperture 28 such as also of 200 $\mu$m diameter. For pulsing, the continuous primary ion beam 23 is swept across the timing aperture 28 by means of the timing deflector electrodes 27. In the preferred embodiment this method of beam pulsing provides primary ion bursts of approximately 2.5 ns duration as measured by the H+ secondary ion peak width.

An electrodynamic buncher 29 is located along the primary ion path 21 directly after the timing aperture 28 in order to obtain further pulse compression, typically to 1.4 ns in the preferred embodiment. The ion pulse then travels through a raster deflector 31 to a gun final lens 32 which focuses the ion beam 23 into a 250 $\mu$m diameter spot on the sample T.

In the pulsed mode or time-of-flight operation, the raster deflector 31 is only used to position the ion beam 23 on a sample T to compensate for deflections suffered while traversing the secondary ion accelerating field. In the continuous beam operation with the timing deflector electrodes 27 deactivated as used for removal of surface layers, the gun final lens 32 focuses the beam down to a diameter of 50 $\mu$m, and the raster deflector 31 is then used to scan the beam over a 750 $\mu$m area to provide flat bottom crater profiles.

Once the primary ion beam 23 strikes the target T, secondary ions are ejected from the target surface. Secondary ions of a selected polarity are extracted and directed along a secondary ion beam path 41, first through an emission lens 42 in the form of an extraction plate followed by an Einzel lens to accelerate the secondary ions. The emission lens 42 is always activated and it always produces a secondary ion crossover and a magnified secondary ion image of the irradiated spot of the sample T. Three spectrometer transfer lenses 43, 44, and 45 are positioned along the secondary ion beam path 41 between the emission lens 42 and the detector to be described below. One of these three spectrometer transfer lenses (43, 44 and 45) is also always activated when the surface analyzer 10 is operating. The first transfer lens 43 is not designed to transport a secondary ion image through the surface analyzer but is designed for large area, such as 0.4 mm diameter, high transmission time-of-flight analysis of the target T. The other two transfer lenses 44 and 45, operate similarly but can also transport secondary ion images with circular imaged sample areas of approximately 200 and 60 $\mu$m diameter, respectively, through the ion assembly 40 to the detector. These imaged areas correspond to magnifications of the secondary ion optics of $60\times$ and $273\times$, respectively, through the ion assembly 40 to the detector.

An aperture 46, called a contrast diaphragm, is positioned at the secondary ion beam crossover produced by the combination of the emission and transfer lenses 42-45. Lateral components of the initial secondary ion velocity distributions produce angular divergences in the secondary ion beam, and the contrast diaphragm 46 is used to limit the angular acceptance of the time-of-flight spectrometer. The contrast diaphragm 46 is followed by a field aperture 47 which is situated just in front of the entrance of the first analyzer 51 of the electrostatic analyzers 51, 52, and 53. The field aperture 47 is used to limit the imaged and analyzed sample area. Each of the three identical 90 degree hemispherical electrostatic analyzers 51-53 has a 10 cm central path radius and the analyzers 51-53 are successively spaced 10 cm apart. Each of the electrostatic analyzers 51-53 is provided with Herzog shunts which nominally terminate the electrostatic analyzer fields at the end of each sector face. Together the electrostatic analyzers 51-53 steer the secondary ion beam 270 degree around onto the final image detector 54. The final image produced with electrostatic analyzers 52 or 53 on the detector 54 is simultaneously achromatic in both the spatial and time coordinates to the first order approximation. The remaining second order aberrations are small.

The gun transfer lenses 24, 26, and 31 and the spectrometer transfer lenses 43, 44, and 45 are designed according to the paper by G. E. Rempfer, "Unipotential Electrostatic Lenses: Paraxial Properties and Aberrations of Focal Length and Focal Point", *J. Appl. Phys.*, 57(7). Apr. 1, 1985. The lens characteristics were checked with a ray tracing program called "SIMION", D. A. Dahl et al, E.G. G-CS-7233, 1987. The emission lens 42 designed was adapted from a paper "An Asymmetric Electrostatic Lens for Field-Emission Microprobe Applications", J. Orloff and L. W. Swanson, *J. Appl, Phys.*, 50(4). April 1979 and checked with SIMION since shape had to be changed somewhat.

Figure 2:
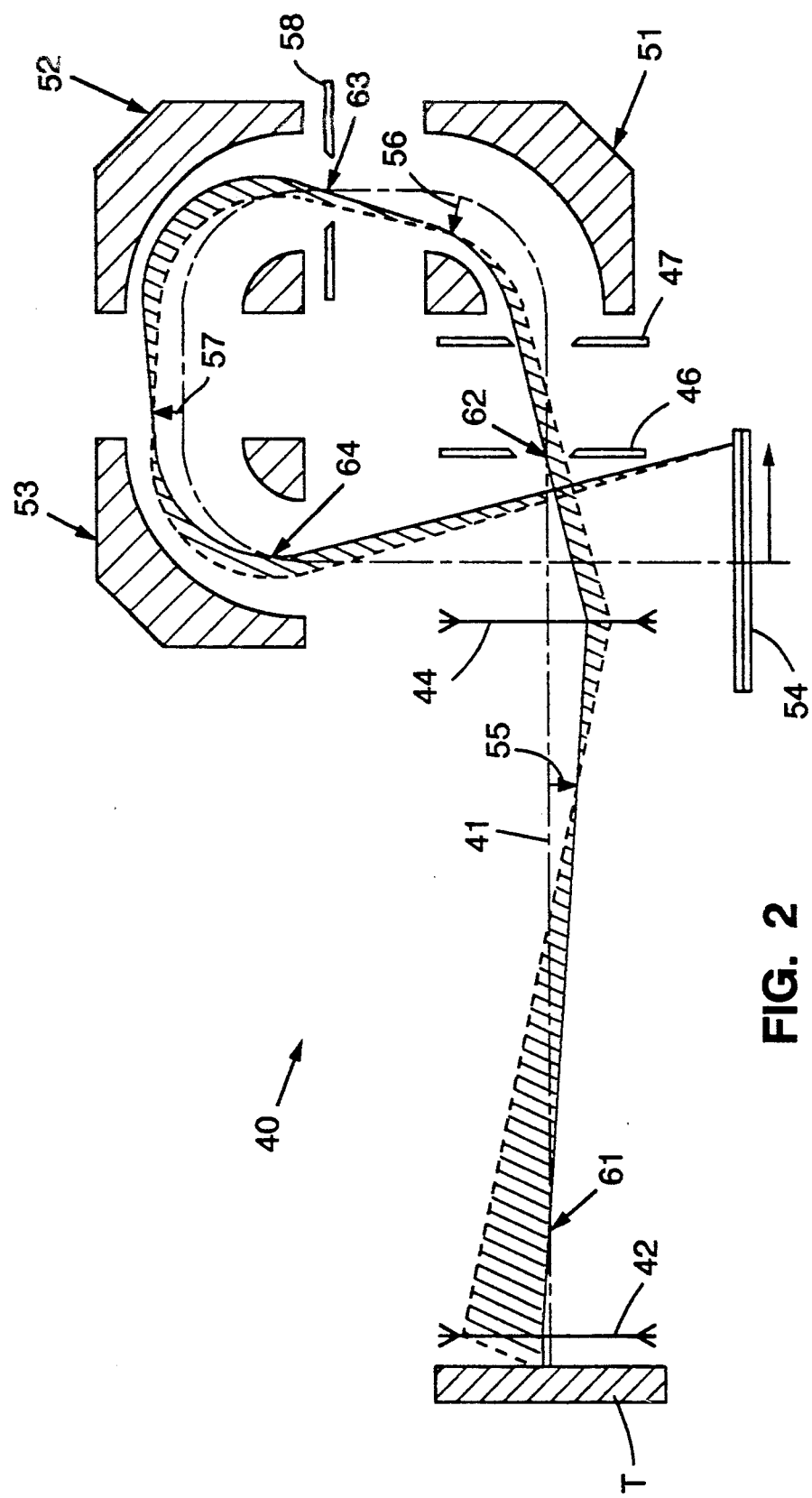
FIG. 2 is a schematic diagram similar to a portion of FIG. 1 and illustrating the secondary ion trajectories through a secondary ion mass spectrometer incorporating the present invention.

FIG. 2 shows a schematic diagram of the secondary ion trajectories through the mass spectrometer or secondary ion assembly 40. Only the activated ion optical elements are shown. The example of the preferred embodiment illustrates the image transport for the combination of the emission lens and the second spectrometer transfer lens 52 in conjunction with the electrostatic analyzer system. The lenses 42 and 43 and each of said spherical analyzers 51, 52 and 53 include object-side and image-side focal planes and entrance and exit surfaces so that the steering means and the lenses provide a plurality of crossover points of the secondary ions with the secondary ion beam path 41.

For the sake of visualization the beam paths have been strongly exaggerated. The three trajectories shown in FIG. 2 are the ideal central ray (- - -) which coincides with the spectrometer axis, an off-axis parallel ray (—) starting with zero initial lateral ion energy, and an oblique ray (- - -) starting at the same position as the off-axis ray but with finite lateral energy. These three rays are sufficient to visualize the image (shown as an arrow ↑) and crossover positions throughout the ion optical system. As in conventional light optics, an image point is, ideally, the place where all rays from an imaged object point intersect regardless of their starting angle (here the lateral energy). The off-axis position of this point of intersection is given by the magnification of the optical system traversed (60×, in this case). In FIG. 2, these image points are the intersections between parallel (—) and oblique (- - -) off-axis rays.

The region of the target surface illuminated by the primary ion beam is magnified through the emission lens 42, and the first intermediate image 55 is created before the transfer lens 44. The transfer lens 44 projects this image 55 into the first electrostatic analyzer 51 where a second (energy dispersed) image 56 is formed close to the exit surface of analyzer 51. A third intermediate image 57 is formed slightly ahead of the entrance surface of the third electrostatic analyzer 53, through which the final strongly magnified image is transported to the image detector 54. The field aperture 47 in front of the entrance surface of the first electrostatic analyzer 51 is used to limit the size of the imaged target sample area.

Important in the functioning of the mass spectrometer system is the proper transport of the secondary ion beam crossover. A crossover is a point in an optical system with zero lateral magnification. The crossover size is independent of the ray's off-axis position, but determined by the lateral ion velocity. The crossover positions are indicated in FIG. 2 as the intersection of the idealized central ray (- - -) and the off-axis parallel ray (—). The first crossover 61 is formed close to the image-side focal plane of the emission lens 42. The first crossover 61 is then demagnified and projected by the transfer lens 44 to the second crossover 62 into a plane close to the object-side focal plane of the first electrostatic analyzer 51. An aperture (contrast diaphragm 46) is placed into this plane to control the angular acceptance of the spectrometer. Limiting the angular acceptance of the ion optical system is important primarily to eliminate aberrations created by the electrostatic Einzel lenses. If the angular acceptance were not limited, the image would be blurred due to spherical aberrations of the lenses. Introducing an angle limiting aperture (contrast diaphragm 46), enhances the contrast of the image. A manipulator holding several different contrast diaphragms 46 of varying sizes allows for stepwise variation of the lateral energy acceptance of the spectrometer from 1 to 7.55 eV.

The second crossover 62 at the contrast diaphragm 46 is then transported through the first electrostatic analyzer 51, and a third crossover 63 is created close to the entrance of second electrostatic analyzer 52. This third crossover 63 is also significant for the spectrometer operation since its size is now primarily determined by the product of the energy dispersion of the first electrostatic analyzer 51 and the range of beam energy. At this point a slit 58 can limit the energy acceptance of the spectrometer to transmit only a selected band of axial energies. For example, this slit 58 can be used to discriminate atomic from molecular secondary ion species based on their different initial axial energy distributions. The energy slit crossover 63 is transported through the second electrostatic analyzer 52 and into the third electrostatic analyzer 53 where a final crossover 64 is formed close to the exit face of third electrostatic analyzer 53.

Aberrations in the mass spectrometer are very significant when the image of the source is not magnified. As the magnification of the image is increased, the size of the image increases more rapidly than do the aberrations so that one can obtain high performance ion images and high performance mass spectrometry because of the magnifying issue.

Figure 3:
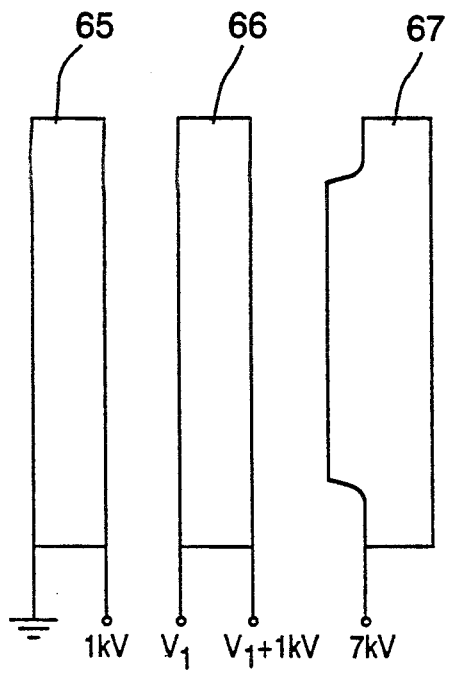
FIG. 3 is an enlarged, side elevational, schematic view illustrating one detector useful in the system of FIGS. 1 and 2.
Figure 4:
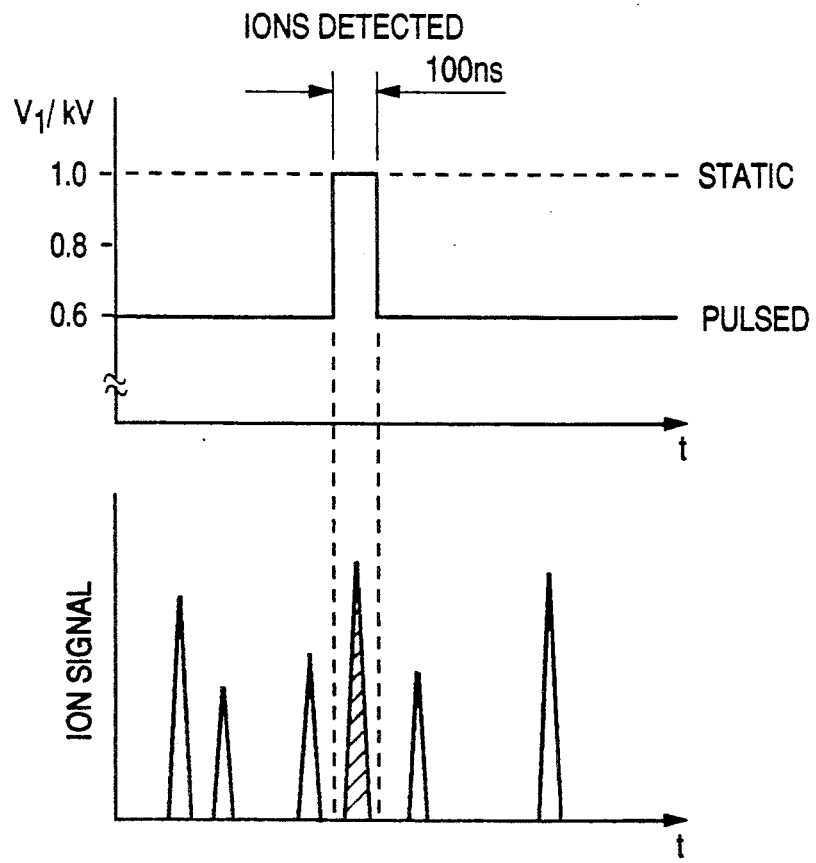
FIG. 4 is a timing diagram of the operation of the detector schematically illustrated in FIG. 3.

In one embodiment of this invention illustrated in FIGS. 3 and 4 the image detector 54 is a combination of a dual microchannel plate detector 65 and 66 with a phosphor screen 67 using a transient recorder for time-of-flight analysis and a camera based imaging system. This system is very effective for time-of-flight recording total secondary ion images or mass separated ion images of a single species and low mass resolution spectra.

The use of transient recorders is effective if a larger number (tens or hundreds) of secondary ions is generated by one primary ion pulse. Since ions of different mass have different flight times through the spectrometer, a time dependent ion current is seen at the dual microchannel plate detector. The dual microchannel plate converts and amplifies this current into an electron current which is then capacitively decoupled, preamplified, and digitized by the transient recorder. Since the detector output is proportional to the time and the number of ions arriving at a given time, a complete mass spectrum can be acquired with a single primary ion pulse. The signal intensities of sputtered secondary ions are often too low to yield statistically significant results and signal averaging techniques are required. Instead of the ion gun 21 as illustrated, a laser pulse can be used for secondary ion generation as in a laser microprobe, and signal averaging is not necessary, since it is possible to adjust the laser irradiance to produce enough ions that a complete mass spectrum can be recorded with a single laser shot.

One option of operation of the surface analyzer 10 employs a 100 MHz transient recorder with signal averaging capability. The start signal for the digitizing scan is derived from the primary ion pulser. This signal gives the time reference for the mass spectra. The time dependent detector output is capacitively decoupled at the phosphor screen 67, preamplified, and processed in the transient recorder. The mass spectra usually represent the average of 65000 spectra, each produced by a single primary ion pulse. In this mode the primary ion beam 23 is pulsed at a repetition rate of 250 Hz, limited by the averaging memory of the transient recorder. Under these conditions the acquisition time for a mass spectrum is approximately 4 minutes.

Although the above detection scheme is fast and effective for operating at high secondary ion count rates where several ions of the same mass can be simultaneously detected without discrimination, it also sets a limit for the performance of the mass spectrometer. The most severe limitation is in the time digitization at 100 MHz, which in turn limits the achievable mass resolution of the analyzer. Since each time channel is 10 ns wide and a digitizing uncertainty of another channel is possible, the minimum expected secondary ion signal width is approximately 20 ns. Under typical operating conditions of the mass spectrometer, the flight time for the $^{208}$Pb isotop is $1.915 \times 10^{-5}$ s. With a signal width 20 ns, the time resolution $t/\Delta t$ is approximately 1460 corresponding to a mass resolution of $m/\Delta m = 730$.

In this detection scheme, secondary ion images are recorded from a phosphor screen by a video camera, and processed in an image processor for permanent image storage and evaluation. In a stigmatic imaging time-of-flight instrument the different masses, and hence mass separated ion images, are delineated only by the arrival time at the detector. In this mode total ion images, i.e. the superimposed image of all ion masses are recorded. This feature proves very useful for the unambiguous identification of an analysis site and typical acquisition times for such images are of the order of 30 s.

With this detection approach, it is also possible to record mass resolved ion images; however only the image of one ion mass at a time. The recording of mass separated ion images in this detection scheme is achieved by time dependent gating of the second microchannel plate of the detector as indicated in FIGS. 3 and 4. The first multichannel plate 65 is operated as usual with its front side at ground potential and the back at approximately 1 kV. In this mode, the voltage at the front of the second multichannel plate 66 ($V_1$) is set about 400V lower than the back of the first plate 65. The back of the second plate 66 is always operated at a voltage ($V_1 + 1$ kV). Under these conditions, the secondary electrons created in the first plate 65 cannot reach the front of the second plate 66 and no signal (except noise) will appear on the phosphor screen 67. At the time ($t_1$) which corresponds to the arrival time of the selected secondary ion mass packet, the second plate 66 can be pulsed up to about 1 kV for a duration of about 100 ns. This briefly reestablishes the normal operating conditions of the dual microchannel plate assembly and transmits the mass selected secondary ion image to the phosphor screen 67 for detection and recording with the image processing system. Using this method of mass separating ion images, unit mass resolution can be achieved in the image up to mass $m/z = 100$. Recording times for the mass separated ion images depend strongly on the imaged species, but are typically in the region of some minutes.

Figure 5:
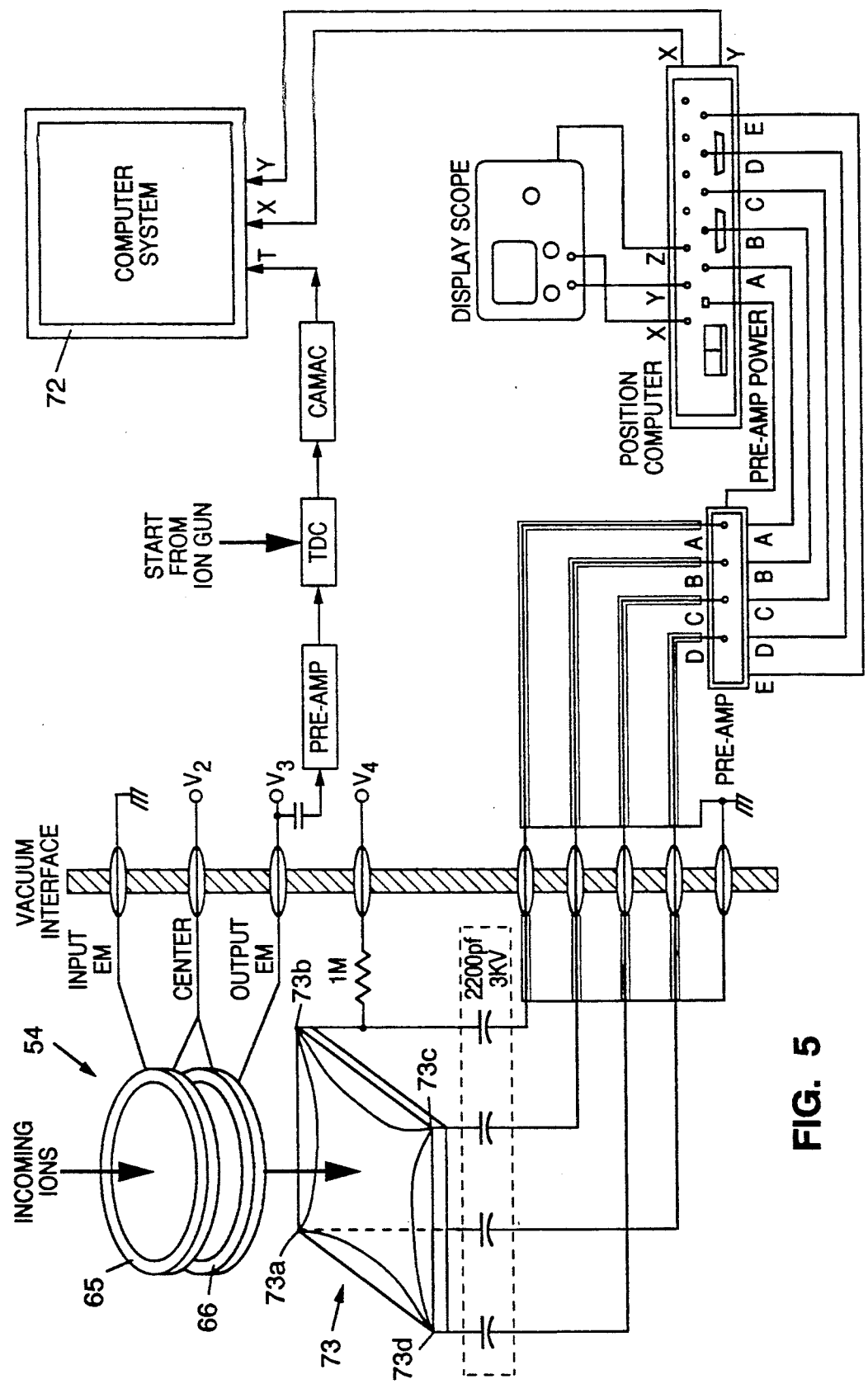
FIG. 5 is a schematic view, partially in prospective and partially in block diagram form, illustrating another detector and display apparatus for the system shown in FIGS. 1 and 2.

An alternative ion and image detection system as illustrated in FIG. 5 can be based on single ion counting with a time-to-digital converter 71 and a position sensitive detector such as a resistive anode encoder 73 enabling the recording of multiple ion images at high mass resolution during mass spectral acquisition. This approach for recording mass spectra employs low primary ion densities per pulse in order to create only one secondary ion but operating at repetition rates of some 10 kHz for pulsing the primary ion beam. The detection scheme can be expanded for detecting several ion masses in a single pulse of the ion gun 22 by use of a multistop time digitizer, however always with the restriction that only one ion of a given nominal mass is detected. This detection scheme can usually provide mass spectra of higher mass resolution as well as of higher mass accuracy since faster and more accurate digitizing electronics are readily available.

The timing sequences for single ion counting are the same as for transient ion detection. The start signal of the time digitizer 71 is given by the pulsing of the ion beam and the stop signal by the arrival of a secondary ion at the detector 54. The detector output is preamplified and fed into a constant fraction discriminator. The constant fraction discriminator provides an output signal which is time correlated to a chosen fraction of the leading edge of the incoming ion signal. This method provides the most accurate timing response since it can be made essentially independent of the incoming signal height. The discriminator output is then fed to the stop input of the time-to-digital converter 71. The resulting time information is digitized and stored in the data acquisition system 72. A single step time-to-digital converter with a maximum time resolution of 156 ps/channel is useful. When operating in the pulsing mode which produces only one to a few secondary ions per primary ion pulse, secondary ion images can be obtained in either of two detection modes. First, imaging can still be achieved by using the described dual microchannel plate, phosphor screen assembly, camera system and image processors of FIGS. 3 and 4, but this method of imaging is strongly restricted by the mass resolution of the ion images, as well as the dynamic range. The alternative approach is to utilize a position sensitive detector such as the resistive anode encoder 73 which preserves the accurate timing information available with the time-to-digital converter.

Using a dual microchannel plate detector 65 and 66 and a resistive anode encoder 73 as shown in FIG. 5, the timing signal for the ion arrival can be accurately extracted from the back of the second channel plate 66. An appropriate resistive anode encoder is Surface Science Laboratories, Mountain View, Calif. Model 3390 with accompanying pre-amp Model 24011 and position computer Model 2401. The position information is obtained from the four electrodes $73a$–$73d$ of the resistive anode encoder 73 behind detector 54 and calculated by means of a position computer. This method of obtaining imaging information at high mass resolution allows images of different ion types of the same nominal mass (e.g. Al from $C_2H_3$) to distinguished.

Figure 8:
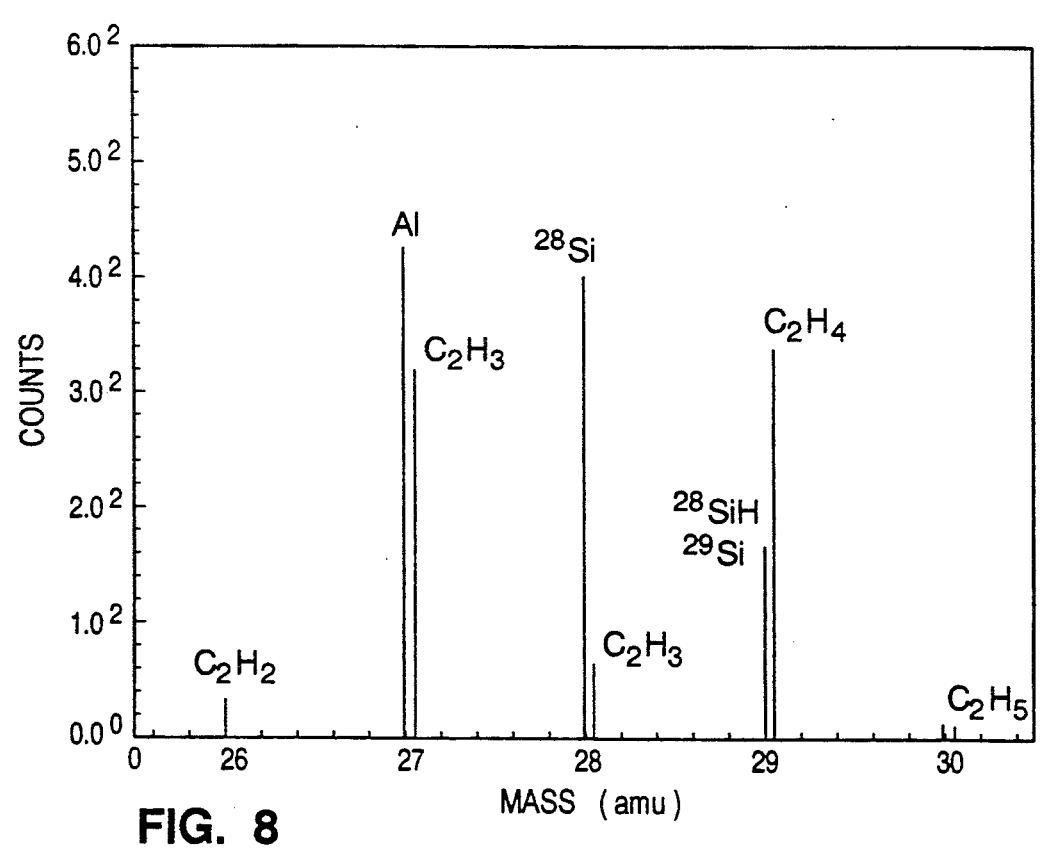
FIG. 8 is the mass spectrum of FIG. 7 replotted over a portion of the range of FIG. 7.

Mass resolution of approximately $m/\Delta m = 3100$, measured at mass $m/z = 28$ amu is produced with the surface analyzer and the time-to-digital 156 ps/channel time resolution. FIG. 8 shows a partial mass spectrum taken from a Si wafer using a pulsed 13 keV Cs+ primary ion with the present invention.

The mass resolution is still determined by the width of the primary ion pulse. The width of the H+ secondary ion signal is 1.4 ns in the same mass spectrum, i.e. only 312 ps shorter than the $^{28}$Si secondary ion signal.

The mass resolution of a time-of-flight spectrometer is strongly dependent on the primary ion pulse width. The stigmatic secondary ion optics of the surface analyzer 10 eases the production of short primary ion pulses for two reasons. First, since stigmatic imaging is employed, the image resolution does not depend on the primary ion spot size or stability. Both of the above parameters deteriorate in the pulsing process. Secondly, the Cs ion gun 22 can deliver enough ions in a single primary ion pulse of ~1 ns length to produce at least one secondary ion from the sample surface.

The situation is different in a non-imaging time-of-flight ion microprobe. Primary ion beam size and stability are essential for imaging. A state of the art liquid ion gun can presently not achieve pulse width of less than 10 ns, thus typically limiting the mass resolution to less than $m/\Delta m = 1000$ on mass 28.

Another important aspect of this time-of-flight mass spectrometer is mass accuracy. Mass accuracy becomes increasingly important with increasing ion mass, e.g. in accurately determining the molecular weight of an ion species at masses of some hundreds of amu. High mass accuracy requires a high degree of linearity in the detection electronics. For an accurate determination of the exact ion flight time (i.e. mass) an accurate peak position is calculated from the peak centroid Although the peak centroid position can be determined from peak widths of only a few channels, higher accuracy is achieved if the detector digitization is performed at better time resolution. Mass accuracy of or better than 2 ppm has been achieved in the exact mass determination at mass 646, the protomated molecular ion of amiodarone.

The mass accuracy of the surface analyzer 10 has been evaluated by determining the molecular weight of a known molecule (amiodarone) of mass M = 465 amu. The mass calibration was obtained as a least squares fit over four masses (H, C, $CH_3$, and $C_2H_3$) The mass of two quasi molecular ion signals, $(M-H)^+$ and $(M+H)^+$, were determined from this calibration. The signal at $(M-H)^+$ was determined within 0.002 amu and $(M+H)^+$ within 0.0005 amu of the actual mass as calculated from the molecular formula. This translates into a mass accuracy of better than 2 ppm. The example also shows that the mass accuracy is somewhat dependent on the signal strength (statistics) of the peak in question.

Figure 6:
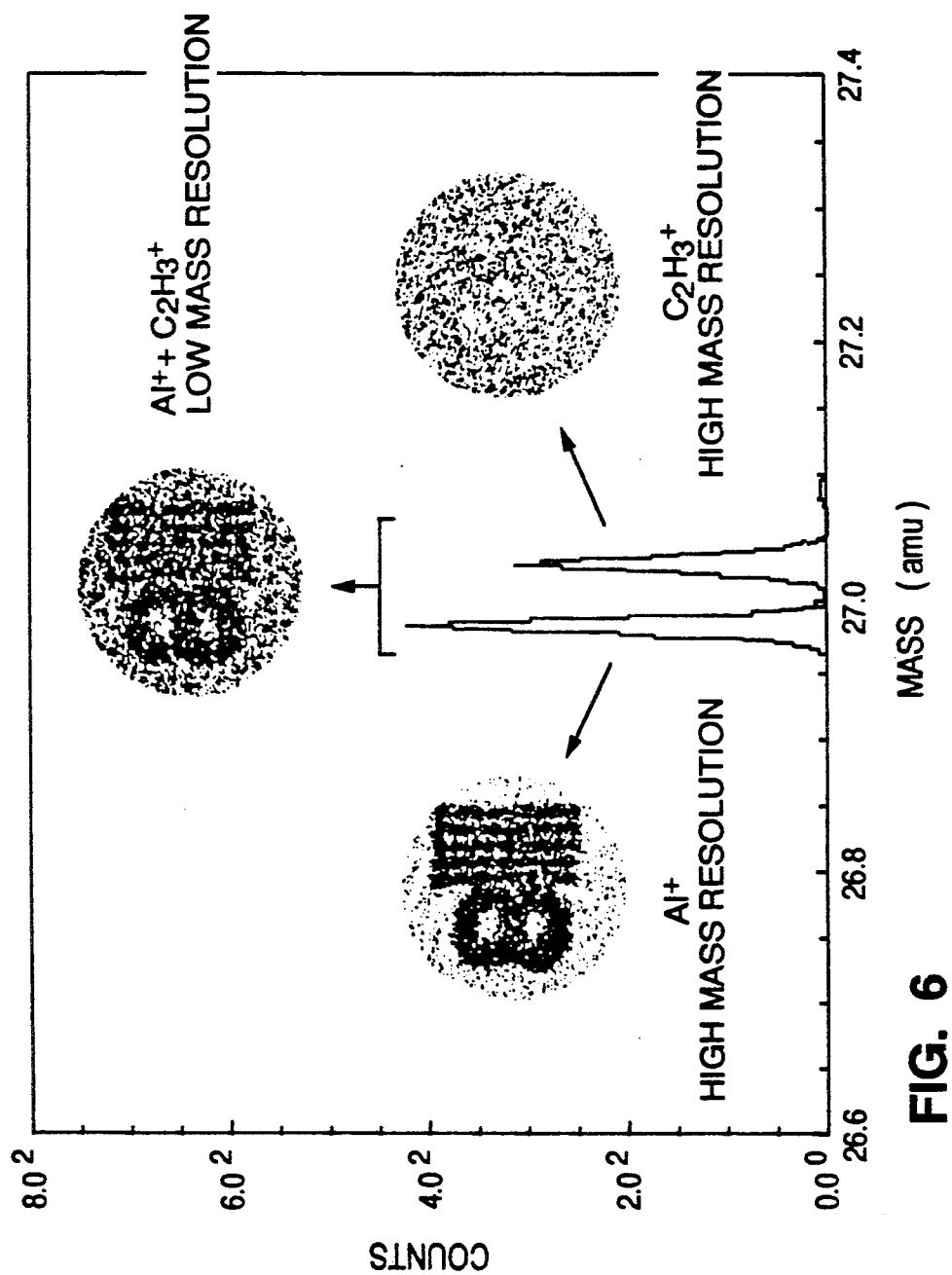
FIG. 6 illustrates an aluminum pattern on a wafer and the mass resolved resistive anode encoder images from the detector using this invention.
Figure 7:
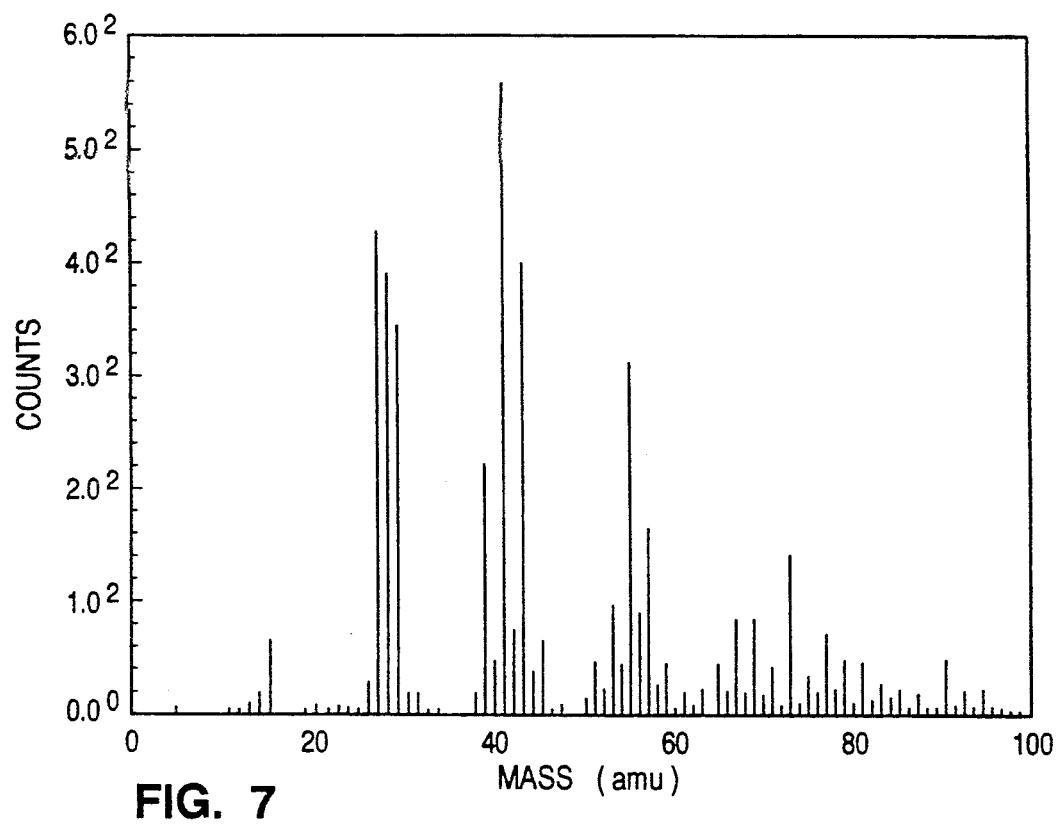
FIG. 7 is a time-to-digital converter mass spectrum plotted for the images of FIG. 6.

FIGS. 6, 7 and 8 illustrate the ability of the surface analyzer 10 to perform high mass resolution imaging on insulating materials. The sample was composed of aluminum lines and the number "8" patterned on a bulk Si $O_2$ substrate and in the configuration shown on the left of FIG. 8. The surface of the sample was heavily contaminated with hydrocarbons ($CH_3$, $C_2H$) requiring high mass resolution to separate the peaks at mass 27 (Al and $C_2H_3$) and at mass 28 (Si and $C_2H_4$).

Surface analyzer 10 instrument configuration included 13 keV $Cs^+$ primary ion bombardment, positive secondary ion spectroscopy, a 20 eV pulsed electron gun for charge compensation, the spectrometer set to image a 180 μm diameter area at an image resolution of approximately 3 μm, and a resistive anode encoder/time-to-digital converter of FIG. 5 as the pulse counting/position sensitive detector combination. Secondary ion counts were recorded at the exit of the output of the second channel plate on the resistive anode encoder detector and counted with the time-to-digital converter. Time (mass) resolved images were acquired and stored in a Hewlett Packard Vectra RS/20 control computer by defining a time window during which processed counts (in this case resistive anode encoder x,y positions) are stored.

A total mass spectrum was acquired to characterize the composition of the sample surface. This mass spectrum is plotted in FIG. 6 over a mass range of 0 to 100 amu. The same mass spectrum was replotted in FIG. 7 over a mass range of 25.5 to 30.5 amu showing the Al, Si and hydrocarbon peaks which can be resolved with the high mass resolution capability of the instrument.

To illustrate the high mass resolution imaging capability of the surface analyzer 10 equipped with a resistive anode encoder, images of Al, $C_2H_3$ and Al+$C_2H_3$ (wide window, Δt) were acquired. The high mass resolution of the instrument, nominally $m/\Delta m = 3000$ in this mass range, easily resolved the atomic and molecular peaks. The image of Al using high mass resolution shows a significant contrast advantage over the Al + $C_2H_3$ image obtained at low resolution. The contribution from the $C_2H_3$ hydrocarbon obscures the useful lateral resolution at mass 27. If a liquid metal gun were employed in this analysis, the increased lateral resolution would again be obscured by the hydrocarbon contribution. With a liquid metal ion gun, pulsed at 30 ns, the mass resolution would be only $m/\Delta m = 300$ at mass 28. This low mass resolution is insufficient to resolve the Al and $C_2H_3$ peaks (requires 650 mass resolution).

It is possible, on occasion, to irradiate the sample with higher doses of primary ions in an effort to remove the hydrocarbons from the surface. However, in the case of organic substrates (i.e. PC boards) the substrate would be severely damaged or modified thereby affecting the analytical results.

This analytical example illustrates two very useful capabilities of the surface analyzer 10, first imaging insulating materials utilizing the charge compensation accessory, and secondly high mass resolution imaging for increased image contrast.

The microfocused ionization source or assembly 20 in conjunction with the mass spectrometer portion of the instrument 10 provides a highly advantageous analytical tool. The beam from this source can also be rastered to produce images in which case the image resolution is determined by the diameter of the source and not by the stigmatic ion optics.

It will be appreciated that within the broad concepts of the present invention the charged particles can be produced by radiation of a solid or gas such as by ions, energetic neutrals, electrons or photons. All that is needed is a source of charged particles, however ionized, formed in an ionization zone with an imposed kinetic energy and a start pulse or a phase reference for Fourier transform mass spectrometry.

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

We claim:

1. A time-of-flight analyzer comprising:
    means for producing charged particles to form an image;
    a charged particle image detector, means for transporting said charged particles along a path from said particle producing means to said detector;
    magnifying lens means positioned on said path between said particle producing means and said detector for imaging said charged particles at said detector;
    means for measuring the time-of-flight of said charged particles from said particle producing means to said detector;
    said mangifying lens means including an emission lens to accelerate the charged particles;
    three spherical analyzers spaced sequentially along said path between said emission lens means and said detector with each spherical analyzer steering said charged particles through substantially 90°; and, said emissions lens and each of said spherical analyzers including object-side and image-side focal planes and entrance and exit surfaces and said lens means and said steering means providing a plurality of crossover points of the charged particles with said path including a first crossover point close to the image-side focal plane of said emissions lens, a second crossover point close to the object-side focal plane of said first spherical analyzer, a third crossover point close to the entrance surface of said second spherical analyzer and a fourth crossover point close to the exit surface of said third spherical analyzer means.

2. In an analyzer having means for producing charged particles to form an image, a charge particle detector and a time-of-flight mass spectrometer for transporting the charged particles along a path to the detector the improvement comprising:

magnifying lens means positioned along said path between said particle means and said detector;

said magnifying lens means including an emission lens to accelerate the charged particles;

three spherical analyzers spaced sequentially along said path between said magnifying lens means and said detector with each spherical analyzer steering said charged particles through substantially 90°; and said emission lens in each of said spherical analyzers including object-side and image-side focal planes and entrance and exit surfaces and said lens means and said steering means providing a plurality of crossover points of the charged particles with said path including a first crossover point close to the image-side focal plane of said emission lens, a second crossover point close to the object-side focal plane of said first spherical analyzer, a third crossover point close to the entrance surface of said second spherical analyzer and a fourth crossover point close to the exit surface of said third spherical analyzer means.

3. A time-of-flight surface analyzer comprising:

means for supporting a target to be analyzed;

means for producing ions from an analytical area of said target;

an ion image detector;

means for transporting a beam of said ions from said ion producing means on a path from said target to said detector;

magnifying lens means positioned on said path between said target and said detector for imaging said ions at said detector whereby a magnified image of the target is produced by said ion beam at said detector;

three spherical electrostatic analyzers spaced sequentially along said path between said emission lens means and said detector with each spherical analyzer steering said ion beam through substantially 90°; and said emissions lens and each of said spherical analyzers including object-side and image-side focal planes and entrance and exit surfaces and said lens means and said steering means providing a plurality of crossover points of the ion beam with said path including a first crossover point close to the image-side focal plane of said emission lens, a second crossover point close to the object-side focal plane of said first spherical analyzer, a third crossover point close to the entrance surface of said second spherical analyzer and a fourth crossover point close tot he exit surface of said third spherical analyzer means.

4. In a surface analyzer having a target, means for producing secondary ions from the target, a secondary ion detector and a time-of-flight mass spectrometer for transporting the secondary ions along a path from the target surface to the detector the improvement comprising:

magnifying lens means positioned on the path between said target and said detector and including an emission lens, and first, second and third secondary ion electrostatic analyzer steering means sequentially positioned along said path from said emersion lens to the detector, each of said electrostatic steering means steering said secondary ions through substantially 90 degrees, said emisson lens and each of said spherical analyzers including object-side and image-side focal planes and entrance and exit surfaces and said steering means and said lens means providing a plurality of crossover points of the secondary ions with the path including a first crossover point close to the image-side focal plane of said emission lens, a second crossover point close to the object-side focal plane of said first electrostatic steering means, a third crossover point close to the entrance of said second electrostatic steering means and a fourth crossover point close to the exit surface of said third electrostatic steering means.

5. A time-of-flight surface analyzer comprising:

means for supporting a target to be analyzed, means for directing primary ions onto the target for producing secondary ions, a secondary ion image detector, means for transporting a secondary ion beam on a path from said target to said detector including a magnifying emission-. lens positioned along said path toward said detector from said target, and first, second and third secondary ion beam electrostatic analyzer steering means sequentially positioned along said path from said emission- lens to said image detector, each of said electrostatic steering means steering said secondary ion beam through substantially 90 degrees, at least one transfer lens positioned along said path between said emission lens and the first of said electrostatic steering means, a contrast diaphragm positioned along said path between said transfer lens and the first of said electrostatic steering means, a field aperture positioned along said ion beam path between said contrast diaphragm and said first of said electrostatic steering means adjacent the ion beam path entrance into said first electrostatic steering means, an energy slit positioned along said ion beam path between said first and said second electrostatic steering means close to the entrance of said second electrostatic steering means and said secondary ion beam having a plurality of crossover points along said ion beam path with substantially zero lateral magnification including a first crossover point close to the image-side focal plane of said emission lens, a second crossover point close to the object-side focal plane of said first electrostatic steering means, a third crossover point close to the entrance of said second electrostatic steering means and a fourth crossover point close to the exit surface of said third electrostatic steering means.

6. In a surface analyzer having a beam of primary ions directed to a target surface for producing secondary ions a time-of-flight mass spectrometer for transporting the secondary ions in a beam along a path from the target surface to a detector the improvement comprising:
- an emission lens positioned on said path in front of said target,
- first, second and third secondary ion beam electrostatic analyzer steering means sequentially positioned along said path from said emersion lens to said detector, each of said electrostatic steering means steering said secondary ion beam through substantially 90 degrees,
- at least one transfer lens positioned along said path between said emission lens and the first of electrostatic steering means,
- a contrast diaphragm positioned along said path between said transfer lens and the first of said electrostatic steering means,
- a field aperture positioned along said ion beam path between said contrast diaphragm and said first of said electrostatic steering means adjacent the ion beam path entrance into said first electrostatic steering means, an energy slit positioned along said ion beam path between said first and said second electrostatic steering means close to the entrance of said second electrostatic steering means and
- said secondary ion beam having a plurality of crossover points along said ion beam path with substantially zero lateral magnification including a first crossover point close to the image-side focal plane of said emission lens, a second crossover point close to the object-side focal plane of said first electrostatic steering means, a third crossover point close to the entrance of said second electrostatic steering means and a fourth crossover point close to the exit surface of said third electrostatic steering means.

7. A time-of-flight analyzer comprising:
- means for producing charged particles to form an image;
- a charged particle image detector;
- means for transporting said charged particles along a path from said particle producing means to said detector;
- magnifying lens means positioned on said path between said particle producing means and said detector for imaging said charged particles at said detector;
- means for measuring the time-of-flight of said charged particles from said particle producing means to said detector;
- said magnifying lens means including an emission lens to accelerate the charged particles;
- three spherical analyzers spaced sequentially along said path between said emission lens means and said detector with each spherical analyzer steering said charged particles through substantially 90°;
- said three spherical analyzers having substantially equal radii and with the spacing between adjacent spherical analyzers substantially equal to said radii; and
- said emissions lens and each of said spherical analyzers including object-side and image-side focal planes and entrance and exit surfaces and said lens means and said steering means providing a plurality of crossover points of the charged particles with said path including a first crossover point close to the image-side focal plane of said emissions lens, a second crossover point close to the object-side focal plane of said first spherical analyzer, a third crossover point close to the entrance surface of said second spherical analyzer and a fourth crossover point close to the exit surface of said third spherical analyzer means.

8. In an analyzer having means for producing charged particles to form an image, a charged particle detector and a time-of-flight mass spectrometer for transporting the charged particles along a path to the detector the improvement comprising:
- magnifying lens means positioned along said path between said particle means and said detector;
- said magnifying lens means including an emission lens to accelerate the charged particles;
- three spherical analyzers spaced sequentially along said path between said magnifying lens means and said detector with each spherical analyzer steering said charged particles through substantially 90°;
- said three spherical analyzers having substantially equal radii and with the spacing between adjacent spherical analyzers substantially equal to said radii; and
- said emission lens in each of said spherical analyzers including object-side and image-side focal planes and entrance and exit surfaces and said lens means and said steering means providing a plurality of crossover points of the charged particles with said path including a first crossover point close to the image-side focal plane of said emission lens, a second crossover point close to the object-side focal plane of said first spherical analyzer, a third crossover point close to the entrance surface of said second spherical analyzer and a fourth crossover point close to the exit surface of said third spherical analyzer means.

9. A time-of-flight surface analyzer comprising:
- means for supporting a target to be analyzed;
- means for producing ions from an analytical area of said target;
- an ion image detector;
- means for transporting a beam of said ions from said ion producing means on a path from said target to said detector;
- magnifying lens means positioned on said path between said target at said detector for imaging said ions at said detector whereby a magnified image of the target is produced by said ion beam at said detector;
- three spherical electrostatic analyzers spaced sequentially along said path between said emission lens means and said detector with each spherical analyzer steering said ion beam through substantially 90°;
- said three electrostatic spherical analyzers having substantially equal radii and with the spacing between adjacent spherical analyzers substantially equal to said radii; and said emissions lens and each of said spherical analyzers including object-side and image-side focal planes and entrance and exit surfaces and said lens means and said steering means providing a plurality of crossover points of the ion beam with said path including a first crossover point close to the image-side focal plane of said emission lens, a second crossover point close to the object-side focal plane of said first spherical analyzer, a third crossover point close to the entrance surface of said second spherical analyzer and a fourth crossover point close to the exit surface of said third spherical analyzer means.

* * * * *